United States Patent [19]

Neuhoff et al.

[11] 4,299,876
[45] Nov. 10, 1981

[54] SOLDERABLE CONDUCTOR PATTERN

[75] Inventors: Donald Neuhoff, Colorado Springs, Colo.; Arthur H. Mones, Phoenix; Kit M. Lam, Peoria, both of Ariz.

[73] Assignee: Honeywell Information Systems Inc., Phoenix, Ariz.

[21] Appl. No.: 159,336

[22] Filed: Jun. 13, 1980

Related U.S. Application Data

[63] Continuation-in-part of Ser. No. 942,727, Sep. 15, 1978, abandoned, which is a continuation-in-part of Ser. No. 861,225, Dec. 16, 1977, abandoned.

[51] Int. Cl.$^3$ .................... B32B 15/00; H01B 1/02; H01B 1/06
[52] U.S. Cl. .................... 428/208; 252/514; 428/209; 428/210; 428/434; 428/469; 428/471; 428/472
[58] Field of Search .................... 428/206–210, 428/457, 469, 471, 472, 434; 106/1.13, 1.18, 1.23, 1.26, 1.29, 53; 252/514

[56] References Cited

U.S. PATENT DOCUMENTS 4,004,057  1/1977  Hoffman et al. .................... 428/209

Primary Examiner—Bruce H. Hess
Attorney, Agent, or Firm—Edward W. Hughes; W. W. Holloway, Jr.; N. Prasinos

[57] ABSTRACT

A solderable conductor pattern is formed on a ceramic substrate. The material of the conductor pattern is made by dispersing gold and certain inorganic binders in an inert liquid vehicle composition. Limited variations in the ranges of the amounts of the material in the composition particularly the range in the amount of copper oxide in the binder produce good adhesion of the pattern to fired substrates and simultaneously provide strong solder joints between leads of electronic devices soldered with a lead-indium solder to pads of a pattern of such material after the pattern has been fired on a substrate without the necessity for physically or chemically cleaning the pads. The binders of the material comprise certain amounts of the crystalline materials, copper in the form of its oxides CuO or $Cu_2O$, cadmium in the form of CdO, lead in the form of $PbF_2$, and the balance being a glass which also contains lead and some cadmium.

2 Claims, 3 Drawing Figures

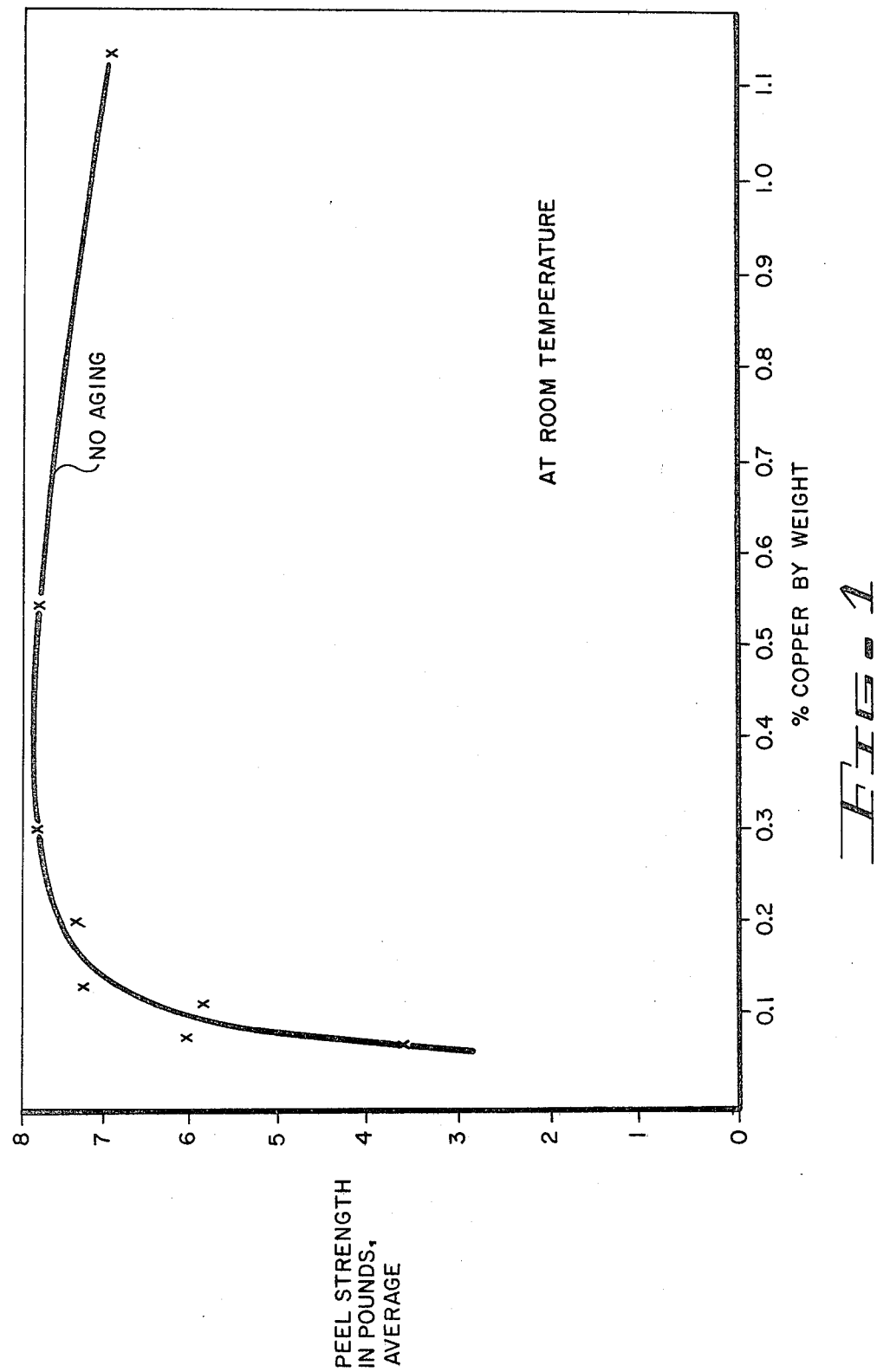

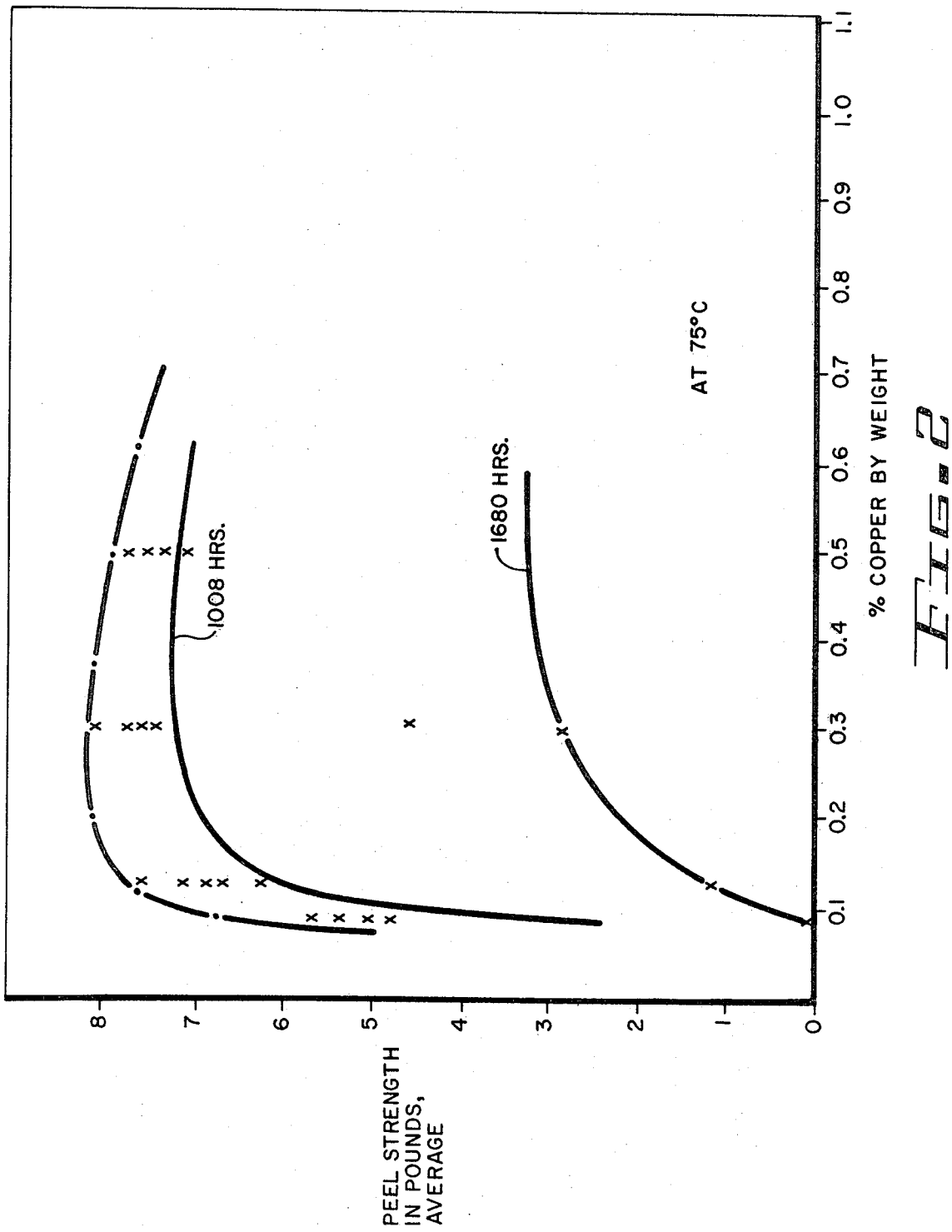

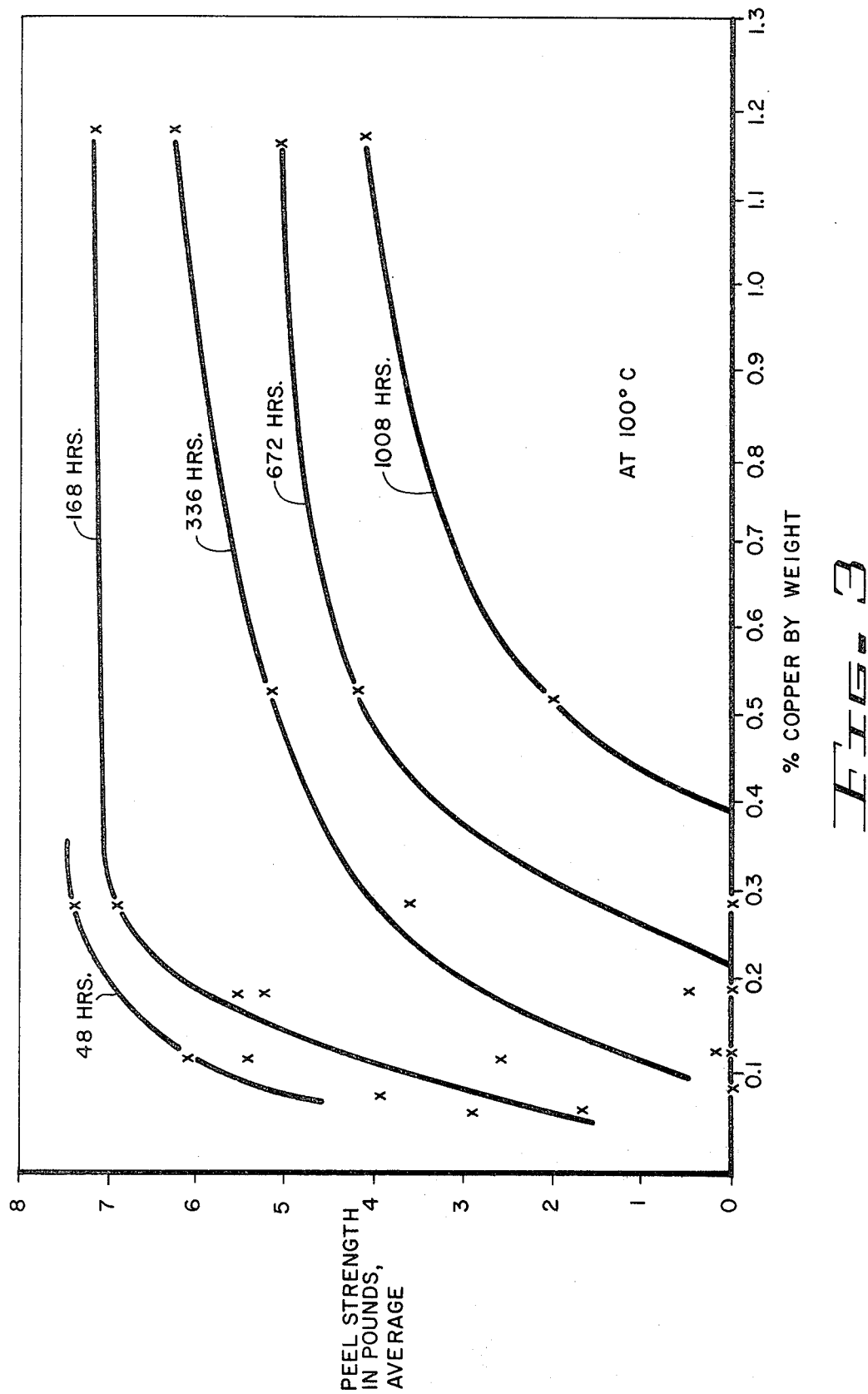

SOLDERABLE CONDUCTOR PATTERN

CROSS REFERENCE TO RELATED APPLICATION

This application is a continuation-in-part of application Ser. No. 942,727 filed Sept. 15, 1978 for Solderable Conductor Pattern, now abandoned, which in turn was a continuation-in-part of application Ser. No. 861,225 filed Dec. 16, 1977 for Solderable Conductor Pattern, now abandoned.

BACKGROUND OF THE INVENTION

1. Field of the Invention

This invention relates to solderable conductor patterns made of noble metal compositions which are adherent to substrates.

2. Description of the Prior Art

Conductor patterns made of compositions, or materials, which are applied to and fired on ceramic, or on ceramic substrates provided with a thick film dielectric layer usually comprise finely divided noble metal particles and inorganic binder particles. Such compositions are commonly applied to substrates as a "thick film," a dispersion of the inorganic materials of the compositions in an inert liquid medium or vehicle. The metallic component of the composition provides an electrical conductor having low electrical resistance while the inorganic binders, such as glass, bonds the metal particles to the substrate.

The most relevant prior art known to applicants is that found in U.S. Pat. No. 4,004,057 which issued on Jan. 18, 1977. This patent discloses patterns made of gold conductor compositions which patterns are formed on substrates by conventional thick film techniques which include firing the substrate after the pattern is printed on it, to produce patterns and pads of such patterns to which electronic components and their leads can be bonded using conventional thermal compression bonding techniques. The particular gold conductor compositions within the scope of the disclosure of U.S. Pat. No. 4,004,057 have excellent adherence to ceramic substrates and such substrates coated with thick film dielectric layers composed, for example, of mixtures of alumina and glass. However, the strength of the solder bond or joint between a pad made of the compositions, a lead pad, and a copper lead precoated with solder varied from being unacceptably weak to being acceptably strong.

The major problem with the prior art conductor composition is that the strength of solder joints between lead pads which are made from some compositions within the ranges disclosed in U.S. Pat. No. 4,004,057 and copper electronic leads soldered to the pad with a 50% lead 50% indium solder have widely varying strengths with some being unacceptably weak both initially and after being aged at elevated temperatures.

It is therefore an object of this invention to provide a solderable conductor pattern on a substrate in which the conductor composition adheres to fired dielectric surfaces of ceramic substrates and to the surfaces of such substrates without dielectric surfaces.

It is another object of this invention to provide an improved solderable conductor pattern on a substrate in which the conductor composition does not need to be physically or chemically cleaned prior to soldering beyond the action of noncorrosive fluxes compatible with the reliability requirements of electronic systems such as digital computers.

It is still another object of this invention to produce an improved solderable conductor pattern in which the gold conductor composition is optimized to maximize the strength of solder bonds between leads of electronic components and the portions, or lead pads of the pattern to which they are soldered while retaining the characteristic that the pattern does not need to be physically or chemically cleaned prior to soldering.

SUMMARY OF THE INVENTION

This invention relates to conductor patterns on fired dielectric surfaces of substrates in which the material of the pattern is a composition of finely divided gold particles and finely divided inorganic binder particles dispersed in an inert liquid vehicle. The chemical composition of the binder and operative and preferred proportions of gold and binder are set forth in Table I. The copper is present as compounds of copper, typically oxides, CuO or $Cu_2O$ with the lead being present as $PbF_2$, and the cadmium as CdO. A composition of a glass suitable for use in the binder is disclosed in U.S. Pat. No. 4,004,057 which issued on Jan. 18, 1977. It should be noted that this glass contains a substantial amount of lead substantially 50% by weight of the glass and a small amount of cadmium substantially 2% by weight in addition to other ingredients.

TABLE I

| Component | Proportions (wt %) | |
|---|---|---|
| | Operative | Preferred |
| Gold | 98–98.8 | 98.5 |
| Binder | | |
| $Cu_2O$ | 0.68–0.22 | .56 |
| $PbF_2$ | 0.35–0.24 | .24 |
| CdO | 0.34–0.23 | .23 |
| Glass | 0.6–0.5 | .50 |

In these compositions there are normally 7–15 parts vehicle and complementally, 85–93 parts inorganic solids (gold plus inorganic binder), although these proportions may be varied depending upon the desired printing properties of the composition.

The fired conductor patterns of this invention can be soldered with lead-indium solder to produce strong solder joints without it being necessary to preclean, either physically or chemically, the pads of the patterns to which leads of electronic components themselves are to be soldered.

BRIEF DESCRIPTION OF THE DRAWINGS

In the drawings:

FIG. 1 is a graph of the relationship between the average peel strength in pounds of solder joints between wire leads and solder pads of conductor patterns using a 50% lead 50% indium solder as a function of the percent of copper by weight of the composition of the solder pads when the joints have not been aged at an elevated temperature.

FIG. 2 is similar to FIG. 1 but shows the relationship between the average peel strength in pounds of such solder joints as a function of the percent of copper by weight of the composition of the solder pads after the test samples are aged, or exposed, to a temperature of 75° C. for the periods of time indicated.

FIG. 3 is similar to FIG. 2 except that the solder joints were aged at a temperature of 100° C. for the times indicated prior to determining the average peel strength of the joints.

DETAILED DESCRIPTION OF THE INVENTION

Applicants have discovered that the amount of binder and the amount of copper in the form of its oxide, preferably $Cu_2O$ in the binder are critical in determining solderability of conductor patterns using a lead-indium solder. The conductor patterns after being fired retain good adhesion to substrates such as those made from commercially pure, 96 to 97% alumina coated with a layer of dielectric of substantially 50 μm of alumina mixed with glass. The amount of binder to produce such a solderable pattern is in the range of from 1 to 2% by weight based on solids. If the amount of copper in the form of its oxides in the binder is too low, the strength of solder bonds between electronic leads and lead pads of the pattern made of the composition is too weak to produce acceptable solder joints particularly after aging at temperatures to which it would be subjected in electronic devices. However, if the amount of copper oxide is too high, the fired pattern must be physically or chemically precleaned prior to soldering which creates unacceptable process problems and reliability problems because of possible damage to electronic components mounted on substrates on which the patterns of this invention are formed.

The inorganic particles used in the pattern, noble metal powders and inorganic binder powders, are usually described as finely divided powders, and are generally sufficiently finely divided to pass through a 200 mesh screen, preferably a 400 mesh screen (U.S. Standard Sieve Scale). Typically, substantially all the particles have dimensions in the range of 2 to 18 microns, preferably 2 to 14 microns.

The metal and binder particles are mixed with an inert liquid vehicle by mechanical mixing, e.g., in roll mills, to form a paste-like composition. The latter is printed as a thick film on conventional dielectric substrates such as alumina or on such an alumina substrate coated with a thin layer substantially 50 μm of alumina mixed with glass in the conventional manner. Any inert liquid may be used as the vehicle such as water or any one of various organic liquids with or without thickening or stabilizing agents, or other common additives. Exemplary of the organic liquids which can be used are terpenes, such as pine oil, terpineol and the like.

The ratio of inert liquid vehicle to solids in the dispersions may vary considerably and depends upon the manner in which the dispersion is to be applied and the kind of vehicle used. While broad proportions of solids to vehicle can be used with the inorganic materials of this invention, preferred compositions comprise the proportions of noble metal, binder, and vehicle set forth in the summary of the invention above. The compositions of the present invention may, of course, be modified by the addition of other materials which do not affect their beneficial characteristics.

After drying to remove the inert vehicle, firing of the patterns after being printed on a substrate is carried out at temperatures and for times sufficient to sinter the inorganic materials and to produce conductor patterns adherent to the dielectric substrate. Depending upon the properties desired and compositions used, the firing temperature is preferably about 925° C. and the time at peak temperature is about ten minutes.

EXAMPLES

The following examples are presented to illustrate the invention. In the examples and throughout the specification and claims all percentages, proportions, ratios, etc., of the key materials of the composition of the patterns are by weight of the metals unless otherwise specifically stated.

Compositions of the materials of the patterns were made using 90.6 to 91.4 parts of inorganic solids (gold and binder) in 8.6 to 9.4 parts of a vehicle of a solvent based on terpineol with a thixotropic agent. The glass used in each example was the glass disclosed in U.S. Pat. No. 4,004,057.

In each sample of material used to print the patterns on a substrate (gold and binder) substantially all the particles were equal to or greater than 2 microns and equal to or smaller than 18 microns in diameter. In each example, binder, noble metal, and vehicle were physically mixed and the resultant composition was printed through a 325 mesh screen (U.S. standard sieve scale) made from stainless steel wire 0.028 mm in diameter on a substrate made from 96 to 97% alumina and having dimensions of 2 mm × 80 mm × 80 mm which is coated with a layer substantially in the range of 50 μm thick of alumina mixed with glass. The screen had 50 uniformly spaced openings 2.4 mm square with the substrate surface being divided into 10 rectangles having dimensions of 16 mm × 40 mm. Five of the 2.4 mm square openings are aligned and uniformly spaced in each of said rectangles.

After a pattern is printed on a substrate, the pattern is allowed to level at a temperature in the range of from plus 22° to 27° C. for at least five minutes. The patterns are then dried at temperatures in the range of from 110° to 130° C. for fifteen minutes minimum in an air atmosphere. The dried conductor patterns on the substrates are then fired in an air atmosphere in an oven, or furnace, at a temperature of 925° C. ±5° C. for seven minutes minimum. Rise and fall rates of the temperature were from 60° to 100° C. per minute. The total cycle time is in the range of from 40 to 45 minutes. The fired thickness of the patterns, particularly pads to which leads of electronic components are soldered, lead pads, was about 20±4 microns. The substrates are then sawed into ten substantially equal test strips with 5 2.4 mm square lead pads of the pattern of fired composition on each strip. The lead pads on each test strip were not abraded, burnished or chemically cleaned except that each test strip was decreased by being immersed in 1, 1, 1 trichlorethane and then dried using nitrogen gas. Each test strip is then preheated in a Brown Bonder to a temperature of 135° C.±5° for three minutes. Each conductor lead pad of a strip is then brushed with a pure water-white rosin flux produced by Alpha Metals Inc. which is sold under the trade name 5002 Microflux, while the bonder is being cycled to +240°±5° C. A solder preform of 50% indium, 50% lead is then placed on each of the five lead pads on a test strip and allowed to flow for two seconds. The test strip is then allowed to cool for two minutes.

A tin coated 20 AWG copper lead wire is dipped into a solder pot containing 50% indium, 50% lead solder at a +265°±5° C. with a layer of 5002 flux on top of the solder. After the wire was coated with solder, it is dipped into perchloroethane at +80°±5° C. to clean off the flux. The conductor lead pads with solder on them are then brushed with rosin flux. The test strip is then placed on a fixture and transferred to a hot plate where it is held at a temperature of 240°±5° C. When the solder starts to reflow, the presoldered wire lead is placed in the center of a conductor lead pad. The test strip is left on the hot plate for substantially two minutes from the time the solder reflows and then removed. After the test strip has cooled, to solidify the solder, flux is removed by dipping the test strip with wires soldered to the conductor lead pads in perchloroethylene at +80°±5° C.

The test strips with the solder wires is then left at room temperature for from 16 to 24 hours prior to "zero" hour adhesion measurements being made and prior to the beginning of thermal aging. The substrates which are aged are stored in an oven at a temperature of 75°±2° C. or 100°±2° for various time periods.

To determine the peel strength of the solder bond between a wire lead and a lead pad of a conductor pattern to which it is soldered, the wire lead is bent so as to be perpendicular to the substrate, i.e., so that the center line of the portion of the wire perpendicular to the substrate is substantially 1.5 millimeters from the edge of the lead pad to which it is soldered. The substrate with the test wires so bent is then mounted on the test instrument, a Chatillon Model HTCM pull tester. A load is applied to a wire in a direction perpendicular to the bond plane at a point determined by the bending radius, substantially ½ inch per minute. As each lead pad is tested, a record is made of the strengths recorded by the instrument at the time a failure occurs. Further, the failure mode is noted. If the wire separates from the solder, the failure is denoted (WS). If the solder separates from the solder pad, it is denoted (SP). If the wire, solder, and the conductor lead pad as an entity separates from the substrate, such a failure is denoted (PD). Finally, if the conductor lead pad separates, or the conductor lead pad substantially splits in two along a plane parallel to the top surface of the test strip, such a failure is denoted as (SPD) since it appears to be a combination of the SP and PD modes. The more desirable types of failure are a ductile failure in the solder (WS or SP). The least desirable type of failure is a failure between a lead pad and the substrates (PD).

A composition of the conductor material of a pattern was prepared having the components in the proportions set forth below.

TABLE II

| Component | Proportion |
| --- | --- |
| Gold | 98.98 |
| $Cu_2O$ | .08 |
| CdO | .24 |
| $PbF_2$ | .26 |
| Glass | .44 |

The results of pull tests on test strips were conducted as described above on the composition of Table II were as follows:

TABLE III

| | TEMP | HRS | NMBR | AVG | STD DEV | FORCE IN POUNDS LOW | FORCE IN POUNDS HIGH |
| --- | --- | --- | --- | --- | --- | --- | --- |
| (1) | 25 | 0 | 10 | 3.56 | .32 | 3.1 | 4.0 |
| PD 10 | 3.6 | | | | | | |
| (2) | 100 | 48 | 10 | 2.96 | .26 | 2.6 | 3.6 |
| PD 10 | 3.0 | | | | | | |
| (3) | 100 | 260 | 10 | 1.72 | .38 | 1.2 | 2.3 |

TABLE III-continued

| | TEMP | HRS | NMBR | AVG | STD DEV | FORCE IN POUNDS LOW | FORCE IN POUNDS HIGH |
| --- | --- | --- | --- | --- | --- | --- | --- |
| PD 10 | 1.7 | | | | | | |

In Table III Line (1) the 10 samples were held at room temperatures 25° overnight which is denoted zero hours. The mean or average force at which the solder joints failed, their peel strength, is 3.56 lbs., the standard deviation is 0.32 lbs., the weakest joint failed at 3.1 lbs. and the strongest at 4.0 lbs. In the line immediately below line (1) the types of failure and number of occasions of each type of failure are listed plus the average force to the nearest tenth at which each such type of failure occurred.

EXAMPLE 2

A pattern of lead pads was printed, dried and fired on a substrate as in Example 1. Test strips were prepared, and presoldered lead wires were soldered to each of them with adhesion or pull tests conducted substantially the same as for Example 1. The composition in this example had components in the proportion set forth in Table IV.

TABLE IV

| Component | Proportion |
| --- | --- |
| Gold | 98.91 |
| $Cu_2O$ | .10 |
| $PbF_2$ | .27 |
| CdO | .26 |
| Glass | .46 |

The results of pull tests on test strips conducted as described above on the composition of Table IV were as follows:

TABLE V

| TEMP | HRS | NMBR | AVG | DEV | FORCE IN POUNDS LOW | FORCE IN POUNDS HIGH |
| --- | --- | --- | --- | --- | --- | --- |
| 25 | 0 | 50 | 6.01 | 1.14 | 4.5 | 9.1 |
| WS 1 8.6 | PD48 5.9 | | CP1 6.8 | | | |
| 75 | 48 | 15 | 5.77 | .54 | 5.1 | 7.0 |
| PD 14 5.7 | SPD1 6.2 | | | | | |
| 75 | 168 | 15 | 4.76 | .84 | 3.3 | 6.1 |
| PD 15 4.8 | | | | | | |
| 75 | 336 | 15 | 5.33 | .46 | 4.2 | 5.8 |
| PD 15 5.3 | | | | | | |
| 75 | 672 | 15 | 5.05 | .53 | 3.8 | 5.6 |
| PD 14 5.0 | SPD1 5.2 | | | | | |
| 75 | 1008 | 5 | 2.68 | .57 | 2.2 | 3.6 |
| PD 5 2.7 | | | | | | |
| 75 | 1680 | 10 | .00 | .00 | .0 | .0 |
| PD 10 .0 | | | | | | |
| 100 | 48 | 15 | 5.23 | .38 | 4.5 | 6.0 |
| PD 15 5.2 | | | | | | |
| 100 | 168 | 15 | 3.97 | .39 | 3.4 | 4.8 |
| PD 15 4.0 | | | | | | |
| 100 | 336 | 15 | .00 | .00 | .0 | .0 |
| PD 15 .0 | | | | | | |
| 100 | 672 | 15 | .00 | .00 | .0 | .0 |
| PD 15 .0 | | | | | | |
| 100 | 1008 | 15 | .00 | .00 | .0 | .0 |
| PD 15 .0 | | | | | | |

EXAMPLE 3

The test strips were prepared as in Example 1 and the tests conducted as described with respect to Example 1. The composition of the material of the conductor patterns had components in the proportions set forth in Table IV.

TABLE VI

| Component | Proportion |
|---|---|
| Gold | 98.84 |
| Cu$_2$O | .11 |
| CdO | .29 |
| PbF$_2$ | .28 |
| Glass | .48 |

The results of pull tests on test strips conducted as described above on the composition of Table IV were as follows:

TABLE VII

| TEMP | HRS | NMBR | AVG | STD DEV | FORCE IN POUNDS LOW | FORCE IN POUNDS HIGH |
|---|---|---|---|---|---|---|
| 25 | 0 | 10 | 5.85 | .36 | 5.4 | 6.4 |
| PD 10 5.8 | | | | | | |
| 75 | 240 | 10 | 5.28 | .36 | 4.9 | 5.9 |
| PD 10 5.3 | | | | | | |

EXAMPLE 4

The test strips were prepared as in Example 1 and the tests conducted as described with respect to Example 1. The composition of the material of the conductor patterns had components in the proportions set forth in Table VIII.

TABLE VIII

| Component | Proportion |
|---|---|
| Gold | 98.82 |
| Cu$_2$O | .15 |
| PbF$_2$ | .28 |
| CdO | .27 |
| Glass | .48 |

The results of pull tests on test strips conducted as described above on the composition of Table VIII were as follows:

TABLE IX

| TEMP | HRS | NMBR | AVG | STD DEV | FORCE IN POUNDS LOW | FORCE IN POUNDS HIGH |
|---|---|---|---|---|---|---|
| 25 | 0 | 50 | 7.18 | .62 | 6.0 | 9.0 |
| PD 11 6.9 | CP27 7.1 | | | | | |
| 75 | 48 | 15 | 6.93 | .87 | 5.6 | 8.4 |
| SPD 14 6.8 | | | | | | |
| 75 | 168 | 15 | 6.82 | .30 | 6.2 | 7.3 |
| CP 14 6.8 | | | | | | |
| 75 | 336 | 15 | 7.19 | .63 | 6.4 | 9.0 |
| SPD 14 7.2 | | | | | | |
| 75 | 672 | 15 | 7.86 | .63 | 6.8 | 8.9 |
| WS 3 8.3 | SP7 7.7 | SPD5 7.8 | | | | |
| 75 | 1008 | 5 | 6.28 | 1.10 | 4.5 | 7.1 |
| SPD 5 6.3 | | | | | | |
| 75 | 1680 | 10 | 1.22 | 1.09 | .0 | 2.7 |
| PD 10 1.2 | | | | | | |
| 100 | 48 | 15 | 6.12 | .55 | 5.3 | 7.2 |
| PD 2 5.6 | SPD13 6.2 | | | | | |
| 100 | 168 | 15 | 5.41 | .75 | 4.0 | 6.2 |
| CD 12 5.2 | | | | | | |
| 100 | 336 | 15 | 2.69 | .78 | 1.7 | 4.1 |
| PD 11 2.4 | SPD4 3.5 | | | | | |
| 100 | 672 | 15 | .11 | .44 | .0 | 1.7 |
| PD 15 .1 | | | | | | |
| 100 | 1008 | 15 | .00 | .00 | .0 | .0 |
| PD 15 .0 | | | | | | |

EXAMPLE 5

The test strips were prepared as in Example 1 and the tests conducted as described with respect to Example 1. The composition of the material of the conductor patterns had components in the proportions set forth in Table X.

TABLE X

| Component | Proportion |
|---|---|
| Gold | 98.91 |
| Cu$_2$O | .22 |
| PBF$_2$ | .24 |
| CdO | .23 |
| Glass | .40 |

The results of pull tests on test strips conducted as described above on the composition of Table X were as follows:

TABLE XI

| TEMP | HRS | NMBR | AVG | STD DEV | FORCE IN POUNDS LOW | FORCE IN POUNDS HIGH |
|---|---|---|---|---|---|---|
| 25 | 0 | 35 | 7.27 | .90 | 5.8 | 9.9 |
| WS 6 8.5 | SP1 9.0 | PD9 6.4 | SPD19 7.2 | | | |
| 100 | 48 | 15 | 5.54 | .91 | 4.6 | 8.0 |
| PD 13 5.3 | CP2 7.1 | | | | | |
| 100 | 168 | 15 | 5.25 | .66 | 4.3 | 6.8 |
| PD 19 5.5 | CP5 4.8 | | | | | |
| 100 | 336 | 15 | .43 | .60 | .0 | 1.8 |
| PD 15 .4 | | | | | | |
| 100 | 672 | 15 | .00 | .00 | .0 | .0 |
| PD 15 0 | | | | | | |
| 100 | 1008 | 15 | .00 | .00 | .0 | .0 |
| PD 15 .0 | | | | | | |

EXAMPLE 6

The test strips were prepared as in Example 1 and the tests conducted as described with respect to Example 1. The composition of the material of the conductor patterns had components in the proportions set forth in Table XII.

TABLE XII

| Component | Proportion |
|---|---|
| Gold | 98.75 |
| Cu$_2$O | .34 |
| PbF$_2$ | .25 |
| CdO | .24 |
| Glass | .42 |

The results of pull tests on test strips conducted as described above on the composition of Table XII were as follows:

TABLE XIII

| TEMP | HRS | NMBR | AVG | STD DEV | FORCE IN POUNDS LOW | FORCE IN POUNDS HIGH |
|---|---|---|---|---|---|---|
| 25 | 0 | 50 | 7.63 | .52 | 7.6 | 9.0 |
| WS 2 8.8 | PD1 7.6 | CP5 8.0 | | | | |
| 75 | 48 | 15 | 7.77 | .67 | 8.3 | 8.9 |
| WS 1 8.9 | CP1 8.3 | | | | | |
| 75 | 168 | 15 | 7.49 | .59 | 7.0 | 8.5 |
| CP 9 7.8 | | | | | | |
| 75 | 336 | 15 | 8.18 | .77 | 8.8 | 9.5 |
| SPD 3 9.1 | | | | | | |
| 75 | 672 | 15 | 7.60 | .78 | 6.8 | 9.4 |
| WS 2 8.8 | SP13 7.4 | | | | | |
| 75 | 1008 | 5 | 4.55 | .65 | 3.7 | 5.5 |
| SPD 5 4.5 | | | | | | |
| 75 | 1680 | 10 | 2.85 | .37 | 2.3 | 3.5 |

TABLE XIII-continued

| TEMP | HRS | NMBR | AVG | STD DEV | FORCE IN POUNDS LOW | HIGH |
|---|---|---|---|---|---|---|
| PD 10 2.9 | | | | | | |
| 100 | 48 | 15 | 7.44 | .67 | 6.0 | 8.4 |
| CP 4 7.7 | | | | | | |
| 100 | 168 | 15 | 6.90 | .58 | .0 | .0 |
| 100 | 336 | 15 | 3.61 | .59 | 2.8 | 4.8 |
| PD 6 3.3 | SPD9 | 3.3 | | | | |
| 100 | 672 | 15 | .00 | .00 | .0 | .0 |
| PD 15 .0 | | | | | | |
| 100 | 1008 | 15 | .00 | .00 | .0 | .0 |

EXAMPLE 7

The test strips were prepared as in Example 1 and the tests conducted as described with respect to Example 1. The composition of the material of the conductor patterns had components in the proportions set forth in Table XIV.

TABLE XIV

| Component | Proportion |
|---|---|
| Gold | 98.4 |
| $Cu_2O$ | .61 |
| CdO | .25 |
| $PbF_2$ | .26 |
| Glass | .48 |

The results of pull tests on test strips conducted as described above on the composition of Table XIV were as follows:

TABLE XV

| TEMP | HRS | NMBR | AVG | STD DEV | FORCE IN POUNDS LOW | HIGH |
|---|---|---|---|---|---|---|
| 75 | 168 | 14 | 7.83 | 1.22 | 5.6 | 9.4 |
| SP 8 7.7 | PD1 | 7.2 | SPD1 | 7.3 | CP4 | 8.5 |
| 75 | 336 | 14 | 7.52 | 1.32 | 5.9 | 9.8 |
| WS 3 9.3 | SP8 | 7.1 | SPD1 | 6.5 | CP2 | 7.2 |
| 75 | 672 | 14 | 7.39 | 1.30 | 5.8 | 9.9 |
| WS 3 9.3 | SP8 | 6.4 | CP3 | 8.1 | | |
| 75 | 1008 | 14 | 7.23 | 1.19 | 5.9 | 9.8 |
| WS 5 8.5 | SP9 | 6.5 | | | | |
| 100 | 336 | 14 | 5.20 | 1.36 | 3.7 | 8.2 |
| WS 1 7.6 | SP11 | 4.8 | CP2 | 6.1 | | |
| 100 | 672 | 14 | 4.23 | .69 | 3.2 | 5.5 |
| SP 5 4.7 | SPD9 | 3.9 | | | | |
| 100 | 1008 | 14 | 1.99 | .51 | 1.4 | 3.2 |
| PD 14 2.0 | | | | | | |

EXAMPLE 8

The test strips were prepared as in Example 1 and the tests conducted as described with respect to Example 1. The composition of the material of the conductor patterns had components in the proportions set forth in Table XVI.

TABLE XVI

| Cpmponent | Proportion |
|---|---|
| Gold | 97.64 |
| $Cu_2O$ | 1.31 |
| CdO | .25 |
| $PdF_2$ | .26 |
| Glass | .54 |

It should be noted that test strips having the composition of Table XV could not be soldered until after they had been abraded physically or chemically cleaned. After being appropriately cleaned, leads were soldered to the pads of the strips. The results of pull tests on such test strips after being cleaned and then soldered were as follows:

TABLE XVII

| TEMP | HTS | NMBR | AVG | STD DEV | FORCE IN POUNDS LOW | HIGH |
|---|---|---|---|---|---|---|
| 100 | 168 | 15 | 7.20 | 1.07 | 5.1 | 9.4 |
| WS 7 7.9 | SP6 | 6.4 | CP2 | 7.1 | | |
| 100 | 336 | 15 | 6.30 | .98 | 4.2 | 7.4 |
| WS 6 7.0 | SP7 | 5.7 | CP2 | 6.5 | | |
| 100 | 672 | 15 | 5.15 | 1.05 | 3.9 | 7.7 |
| WS 1 7.7 | SP13 | 4.8 | CP1 | 6.9 | | |
| 100 | 1008 | 14 | 4.64 | .62 | 3.3 | 5.5 |
| SPD 14 4.6 | | | | | | |

The data of Tables III, V, VII, IX, XI, XIII, XV and XVII which provide the average peel strength in pounds at which the solder joints failed provide the points used in determining the curves of FIGS. 1, 2 and 3. Peel strength is the ordinate and the percent of copper is the abscissa. A perusal of FIG. 1 which is a plot of the points for no aging, or more accurately where the test samples were stored at room temperature for up to a maximum of 24 hours, shows a very rapid drop off in the strength of such joints beginning at around 0.2% copper with a substantial leveling off of the peel strength of such joints as the amount of copper is increased at least through 1.1% Cu. In FIGS. 1, 2 and 3, for purposes of illustration, the units of the abscissa are expressed in weight percentage of copper is derived from the weight pecentage of Cu O multiplying the weight percentage of $Cu_2O$ by the ratio of the atomic weight of 2 Cu by the atomic weight of $Cu_2O$:

$$\frac{2(63.57)}{2(63.57) + 16} = \frac{127.14}{143.14} = .888$$

The data used in FIG. 2 was obtained from test strips which were aged at 75° C. a temperature which approximates the upper end of the temperatures to which the joints would be subjected in electronic systems such as computers. There is a band of closely spaced points between tests at 48 hours and 1,008 hours in which the pad strength of the solder joints does not decrease very rapidly as a function of time. Thereafter there is a rapid fall off in the peel strength between 1,000 hours and 1,680 hours. Again the curves drop off very rapidly when the amount of copper is reduced below 0.2% copper.

In FIG. 3, the data was obtained from test strips which were aged at 100° C. The curves show a decrease in peel strength as a fraction of aging time. Again there is a rapid drop off in peel strength as the amount of copper in the composition is decreased below 0.2% but an increase in the strength of the joints after aging as the amount of copper is increased. The test results indicate that increasing the amount of copper tends to increase the strength of the joints particularly after aging.

However, somewhere in the range of from 0.54 and 1.1% of copper the composition can no longer be soldered without some form of chemical or physical cleaning of the pattern after it has been sintered on the substrate. Thus, applicants have discovered that there is an optimum range in the amount of copper in the composition between 0.2% and 0.6% at which the pattern is solderable without having to be cleaned and produces solder joints of acceptable strength. It should be noted that the peel strength of the joints decreases as a function of aging as the amount of copper is increased until a maximum amount of copper is present. However when the amount of copper in the composition exceeds a certain maximum percentage the pattern must be cleaned immediately prior to soldering if good solder joints are to be obtained, which is unacceptable for reasons pointed out above. In all such tests the adhesion of the composition to the substrate after firing was good.

In general the peel strengths of the samples having less than 0.2% copper have a relatively rapid rate of degradation as a function of time and temperature with the lower limit of the amount of copper that will produce joints of acceptable strength being about 0.2%. In the range of from 0.2 to 0.6% copper the strength of such joints both initially and after aging has more stability for longer periods of time under each thermal condition. While the 1.0% copper composition exhibited excellent initial characteristics and aging characteristics, it does not have the desirable attribute of being solderable without being prepared either by physical abrasion or by a chemical cleaning. Overall under 0.2% is the lower limit of the desired range and 0.6% is the upper limit in the range of the copper.

What is claimed is:

1. Fired conductor patterns which are adhered to a substrate and are solderable with a lead indium solder, said patterns having a composition by weight of 98.2 to 98.7% gold particles and 1.8 to 1.0% inorganic binder particles, the binder consisting essentially by total weight of gold and binder, 0.68 to 0.39% $Cu_2O$ 0.35 to 0.24% $PbF_2$ 0.34 to 0.23% CdO and the balance glass.

2. The fired conductor pattern of claim 1 in which the solder substantially consists of 50% lead and 50% indium.

* * * * *